(12) United States Patent
Wang et al.

(10) Patent No.: US 9,134,627 B2
(45) Date of Patent: Sep. 15, 2015

(54) MULTIPLE-PATTERNING OVERLAY DECOUPLING METHOD

(75) Inventors: Wen-Chuan Wang, Hsinchu (TW); Shy-Jay Lin, Hsinchu County (TW); Pei-Yi Liu, Changhua (TW); Jaw-Jung Shin, Hsinchu (TW); Burn Jeng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 760 days.

(21) Appl. No.: 13/328,264

(22) Filed: Dec. 16, 2011

(65) Prior Publication Data

US 2013/0157389 A1    Jun. 20, 2013

(51) Int. Cl.
*H01L 21/66* (2006.01)
*G03F 7/20* (2006.01)
*H01L 23/544* (2006.01)

(52) U.S. Cl.
CPC .......... *G03F 7/70633* (2013.01); *H01L 23/544* (2013.01); *H01L 2223/5442* (2013.01); *H01L 2223/5446* (2013.01); *H01L 2223/54426* (2013.01); *H01L 2223/54453* (2013.01); *H01L 2924/0002* (2013.01)

(58) Field of Classification Search
None
See application file for complete search history.

(56) References Cited

U.S. PATENT DOCUMENTS 6,908,775 B2 *    6/2005    Heine et al. .................... 438/14

* cited by examiner

*Primary Examiner* — Seahvosh Nikmanesh
(74) *Attorney, Agent, or Firm* — Haynes and Boone, LLP

(57) ABSTRACT

A method for fabricating a semiconductor device is disclosed. An exemplary method includes forming a first structure in a first layer by a first exposure and determining placement information of the first structure. The method further includes forming a second structure in a second layer overlying the first layer by a second exposure and determining placement information of the second structure. The method further includes forming a third structure including first and second substructures in a third layer overlying the second layer by a third exposure. Forming the third structure includes independently aligning the first substructure to the first structure and independently aligning the second substructure to the second structure.

20 Claims, 10 Drawing Sheets

MULTIPLE-PATTERNING OVERLAY DECOUPLING METHOD

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, stricter demands have been placed on multiple-patterning processes. For example, smaller devices which use multiple-patterning on multiple layers require that the alignment between various layers in the semiconductor device (also referred to as overlay) be precise and accurate. In other words, it is desirable to reduce the overlay error. Although existing multiple-patterning methods have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
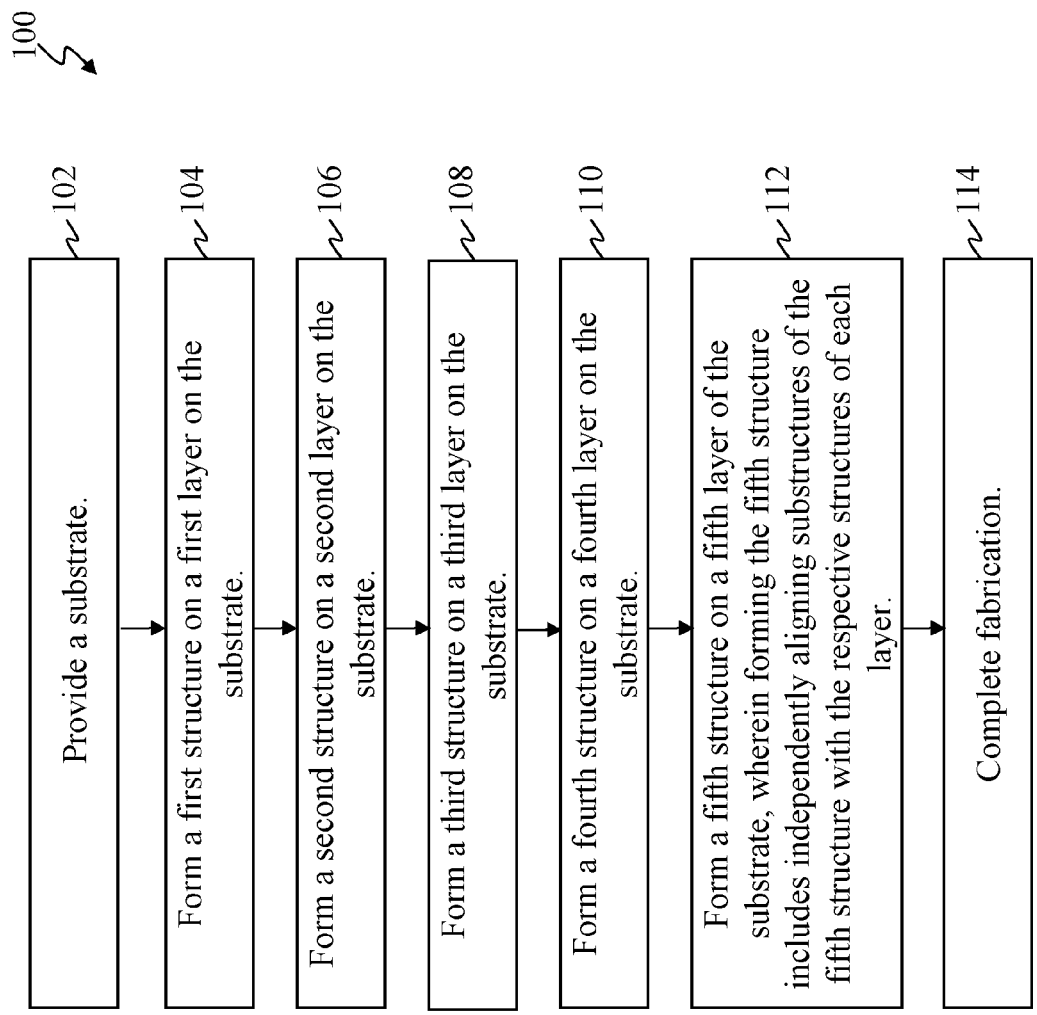
FIG. 1 is a flowchart illustrating a method of aligning multiple layers on a wafer according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

With reference to FIGS. 1-10, a method 100 and an integrated circuit device are collectively described below. FIG. 1 is a flowchart illustrating a method of aligning multiple layers including structures on a wafer according to various aspects of the present disclosure. The method 100 begins at block 102 where a wafer having a substrate is provided. At block 104, a first structure is formed on a first layer of the substrate. Forming the first structure may include one or more patterning, etching, and/or depositing a steps. At block 106, a second structure is formed on a second layer of the substrate. Forming the second structure may include one or more patterning, etching, and/or depositing a steps. The method continues with block 108 where a third structure is formed on a third layer of the substrate. Forming the third structure may include one or more patterning, etching, and/or depositing a steps. At block 110, a fourth structure is formed on a fourth layer of the substrate. Forming the fourth structure may include one or more patterning, etching, and/or depositing a steps The method 100 continues with block 112 where a fifth structure is formed on a fifth layer of the substrate. Forming the fifth substrate may include one or more patterning, etching, and/or depositing a steps. Forming the fifth structure includes independently aligning substructures of the fifth structure with the respective structures of each underlying layer. The aligning may include using a data file including multiple sets of parameters to define overlay error associated with each structure of each underlying layer. It is understood that the method 100 may include forming any number (e.g., n-number) of structures on any number (e.g., n-number) of layers. Additional steps can be provided before, during, and after the method 100, and some of the steps described can be replaced or eliminated for other embodiments of the method. The discussion that follows illustrates various embodiments of forming structures on multiple layer according to the method 100 of FIG. 1.

Figure 2:
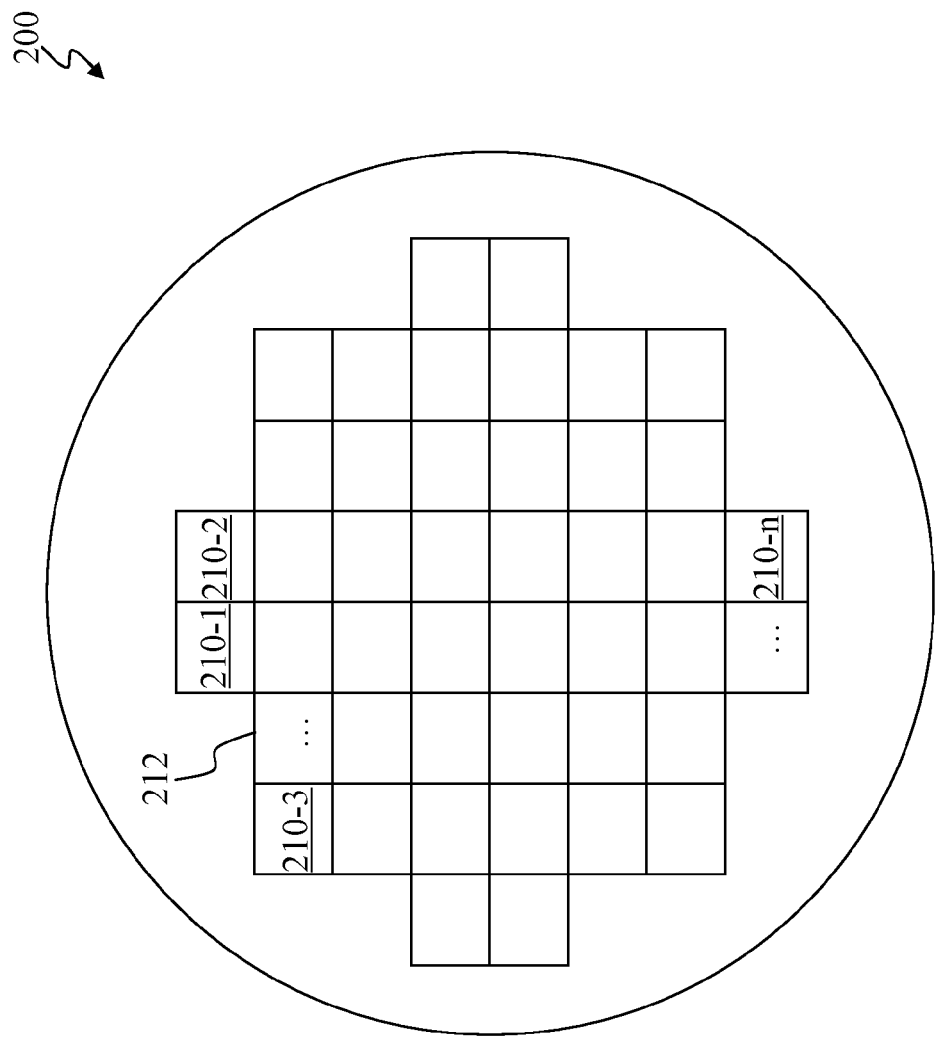
FIG. 2 illustrates a top view of a wafer according to various embodiments of the present disclosure.

FIG. 2 illustrates a top view of a wafer of the method of FIG.1 according to various embodiments of the present disclosure. The wafer 200 includes a substrate (e.g., a semiconductor substrate), a mask (photomask or reticle, collectively referred to as mask), or any base material on which processing is conducted to produce layers of material, pattern features, and/or integrated circuits. For example, the wafer 200 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In some examples, the silicon substrate may include a multilayer compound semiconductor structure. Alternatively, the wafer 200 may include a non-semiconductor material, such as a glass substrate for thin-film-transistor liquid crystal display (TFT-LCD) devices, or fused quartz or calcium fluoride for a photomask (mask).

As further discussed below, the wafer 200 is subjected to one or more deposition, patterning, and/or etching process to form a plurality of patterned and un-patterned layers thereon. For example, the wafer 200 is subjected to a lithography process to form one or more features on the wafer. In the present embodiment, the wafer 200 is subjected to a lithography process to form an integrated circuit device thereon. The term lithography includes immersion lithography, photolithography, and optical lithography. The lithography process projects an image of an integrated circuit device onto an exposure field 210 of the wafer 200 thereby transferring a pattern (i.e., image of an integrated circuit device) from a mask (also referred to as a photomask or reticle) onto the wafer. The process can involve projecting the image multiple times on the wafer 200, each projection patterning an exposure field 210 of the wafer 200. As illustrated in FIG. 1, the wafer 200 is divided into one or more fields 210. The wafer 200 is divided into exposure fields 210-1, 210-2, 210-3, . . . , and 210-n. The fields 210 are separated or defined by scribe lines (or lanes) 212. In the present embodiment, the scribe lines 212 are configured between each field 210 to identify a perimeter of each field 210. An exposure field includes an area of a substrate exposed by an exposure process (e.g., optical exposure, or electron beam (e-beam) exposure). So, when the wafer 200 is subjected to a lithography process, an exposure process may be used to transfer a pattern to each field (i.e., 210-1, 210-2, 210-3, . . . 210-n) to form integrated circuits within each field 210. When each field 210 is exposed, one or more dies (chips) are patterned within the field 210.

Figure 3:
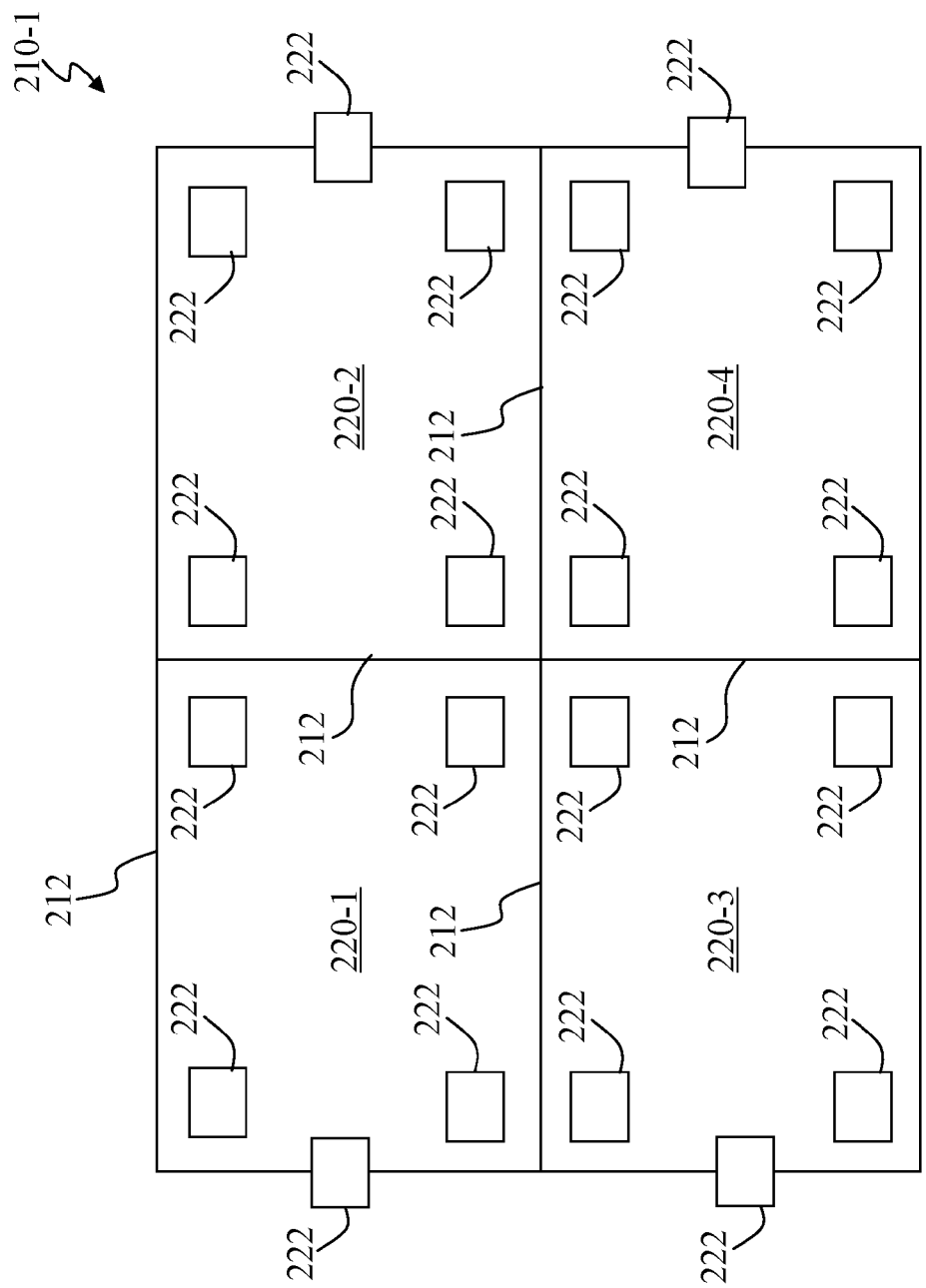
FIG. 3 illustrates a top view of an exposure field including dies/chips having device regions and alignment regions, according to various aspects of the present disclosure.

FIG. 3 illustrates a top view of an exposure field including dies/chips having alignment regions including alignment marks formed according to the method of FIG. 1. Referring to FIG. 3, one or more dies (chips) 220 of the wafer 200 are patterned within each exposure field 210, and thus, multiple dies can be patterned within a single exposure field 210. An exposure field 210 can pattern a 1×1 array (i.e., a single chip), a 1×2 array (i.e., two chips), a 2×2 array (i.e., four chips), up to a n×m array within each exposure field 210. In the illustrated embodiment, a 2×2 array is shown on exposure field 210-1. Where multiple exposure fields 210 are delineated on the wafer 200, as in FIG. 2, the pattern is formed in each exposure field 210. For example, if an exposure filed 210 patterns a 2×2 chip array, each exposure field 210 (i.e., exposure fields 210-1, 210-2, . . . 210-n) will include four patterned chips/dies (220-1, 220-2, 220-3, 220-4). Similarly to delineation of the fields 210, scribe regions/lines 212 separate (or define) adjacent dies 220. The scribe regions/lines 212 are dice/cut therethrough in a later fabrication process to provide individual dies, which may then be packaged and sold as individual integrated circuit chips. The scribe regions/lines 212 are cut in such a way that the semiconductor devices formed in each die are not damaged.

As noted above, lithography processes (or other exposure process) form features on the wafer. In the present example, integrated circuit devices are formed on the wafer 200 to form a plurality of dies 220. The lithography process patterns a sequence of patterned and un-patterned layers, and the features on successive patterned layers are spatially related to each another. During fabrication, each patterned layer must be aligned with the previous patterned layers with a degree of precision. Thus, a key part of successful lithography relies on pattern alignment techniques. A lower (previous) patterned layer will include an overlay target, and a second pattern on an upper (next) patterned layer can then be aligned.

Pattern alignment techniques utilize alignment regions 222 that include alignment marks. The alignment regions may be placed on the scribe lines 212 surrounding each field 210 or within select regions within each die 220 of the field 210. According to design requirements, the alignment regions 222 may be located anywhere within the field 210 or on the scribe lines 212 surrounding each filed 210. The alignment regions 222 may include various types of alignment marks as determined by design specifications. For example, the alignment regions 222 may include box-in-box (BIB) pattern alignment (or overlay) marks. The BIB alignment marks utilize an overlay target (i.e., an outer box) and an inner box. The alignment technique aligns the inner box with the overlay target. The outer box may be formed in lower (previous) patterned layers and the inner box will be formed in an upper (next) patterned layer. There may be one or more layers between the two patterned layers. The alignment (or overlay) marks 222 may be formed in any suitable layers. The alignment marks 222 may be designed to include shapes other than boxes, including triangles, rectangles, circles, T-shapes, L-shapes, pluses, crosses, octagons, other suitable shapes, and/or combinations. Also, the pattern alignment techniques may utilize other target designs, such as frame-in-frame, segmented-frame, advanced imaging metrology (AIM), and short vernier (SVNR).

In an exemplary pattern alignment method, the outer box is exposed to radiation by a suitable generator. The radiation includes visible, invisible, fluorescent, and/or polarized (which may include a single mode or multiple mode) radiation. For example, the generator can include an invisible electromagnetic wave generator, which generates a variety of invisible electromagnetic waves, including X-ray, ultraviolet (UV), and/or deep ultraviolet (DUV) waves. It is further contemplated that the radiation may possess a single wavelength or multiple wavelengths. Reflective beams from the outer box are then detected by a detector, which may include a wavelength dispersive spectrometer, an energy dispersive spectrometer, and/or other detectors. When the reflective beams are detected, the location of the outer box may be identified. As a result, the inner box may be properly positioned.

Figure 4:
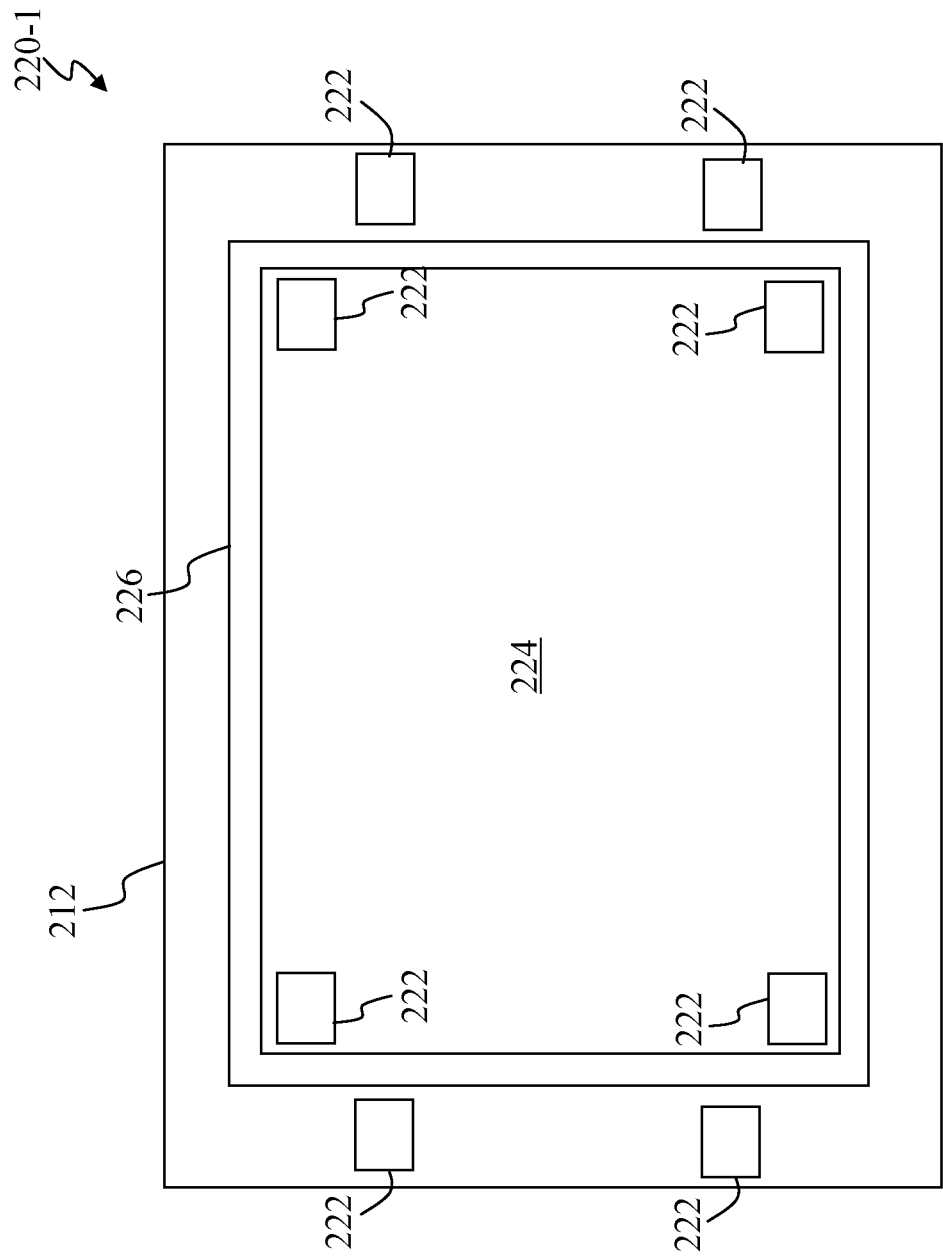
FIG. 4 illustrates a top view of an exposure field including a chip having a device region, according to various embodiments of the present disclosure.

Referring to FIG. 4, an exemplary field is illustrated including a single chip (i.e., 1×1 chip array) 220-1 patterned within exposure filed 210-1. As noted above, scribe lines 212 define the perimeter of the exposure field 210-1 and the chip 220-1. The scribe lines 212 may comprise any suitable dimensions. The chip/die 220-1 includes an integrated circuit region (including one or more device regions) 224. The integrated circuit region comprises a plurality of layers, such as active layers (OD layers, defining active areas of the integrated circuit region), poly layers (PO layers, defining gate areas of the integrated circuit region), contact layers (CO layers, defining contacts to the OD and PO layers), N-well implant layers (NW layers), P-well implant layers (PW layers), P+ implant layers (PP layers), N+ layers (NP layers), metal layers (M1, M2, . . . MN), transistor threshold adjustment implant layers (VT layers), and/or other suitable layers. The plurality of layers in the integrated circuit region 224 form a variety of devices, including passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof.

The die 220-1 further includes a seal ring 226 and a corner stress relief zone. A portion of the corner of the die 220-1, which includes a portion of the seal ring 226 and corner stress relief zones, may be referred to as a die-corner-circuit-forbidden (DCCF) region. In the present embodiment, the seal ring 226 surrounds the perimeter of the integrated circuit region 224. The seal ring 226 creates a barrier to penetration of moisture, corrosive gases, and chemicals into the interior of the integrated circuit region 224. The seal ring 226 may comprise multiple layers. For example, the seal ring may comprise a plurality of conductive layers, a plurality of insulating layers, a plurality of vias and contacts, a plurality of metal layers, and/or combinations thereof. It is understood that, in some embodiments, the die 220 may comprise only an integrated circuit region 224 without a surrounding seal ring 212.

Figure 5:
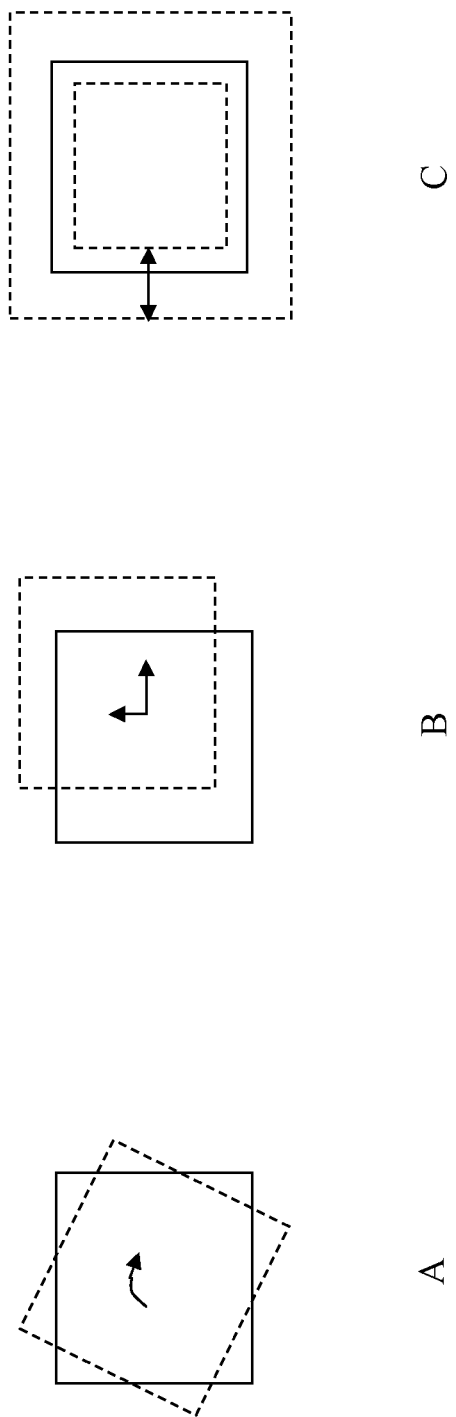
FIG. 5 illustrates a top view of exemplary overlay errors, according to various aspects of the present disclosure.

Referring to FIG. 5, although the plurality of layers are aligned, there are still overlay errors associated with each layer/structure. The overlay errors, for example, may be translational error (A), rotational error (B), run-in/run-out errors (C), or other production induced errors. Translational errors may be errors in aligning the current layer in the x and y direction. Rotational errors may be errors in aligning the current layer about a central axis. Run-in-run-out errors may errors where the diameters of the mask or wafer has changed such that the two regions are no longer aligned. Run-in/run-out error may be due to thermal variations during production. For example, a change of mask and wafer temperature will produce overlay run-in/run-out errors stemming from the fact that the mask and wafer may have differing coefficients of thermal expansion. As such, the diameters of the mask and the wafer will no longer be the same.

Figure 6:
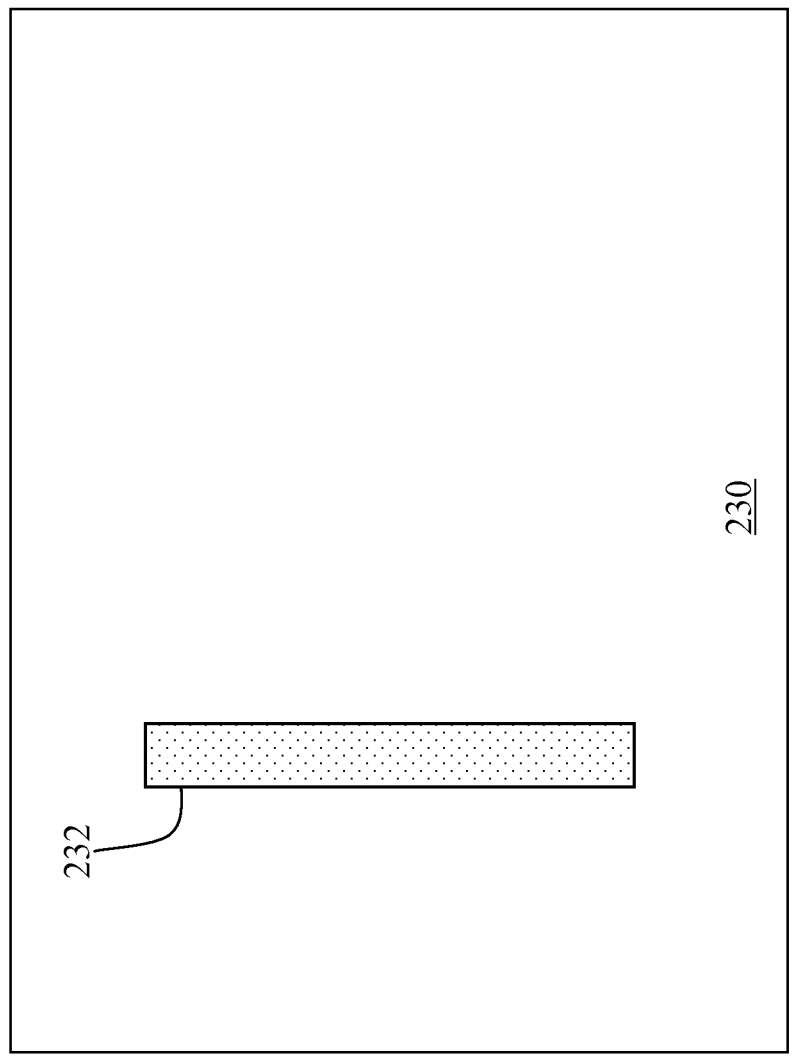
FIGS. 6-10 illustrate a top view of a die including a structure formed according to the method of FIG. 1.

Referring to FIGS. 6-10, illustrated is a top view of a die including a device structure formed according to the method of FIG. 1. It is understood that the structure formed according to the method of FIG. 1 is merely exemplary. Thus, the specific structure illustrated herein is not limiting unless specifically claimed. Referring to FIG. 6, the integrated circuit region 224 includes a substrate 230. Formed on a first layer of the substrate 230 is a first structure 232. It is understood that although the layer upon which the first structure 232 is formed is denoted as the "first" layer, there may actually be other layers underlying the first layer. The first layer may be a poly layer The first structure 232, for example, may be a first poly-gate structure formed on the first layer of the integrated circuit region 224. Forming the first structure 232 may include one or more patterning, optical exposure, e-beam exposure, etching process, and/or deposition process. In the present embodiment, forming the first structure 232 includes a lithography process that optically exposes a pattern onto the first layer of the substrate 230. During the formation of the first structure 232 on the first layer, an alignment technique is used to properly align the first layer and to determine the placement or overlay information of the first layer/structure 232. The placement or overlay information may include actual coordinates, which may be compared to the design coordinates. The pattern alignment technique is similar to the pattern alignment technique as described above, which, for example, may use alignment marks formed in alignment regions of the wafer (see FIGS. 3-4). The placement information of the first structure 232 and the first layer, along with other multiple sets of parameters, is stored in a first data file which is used in subsequent alignment. The data file may be, for example, a .txt data file, or any other data file format.

Figure 7:
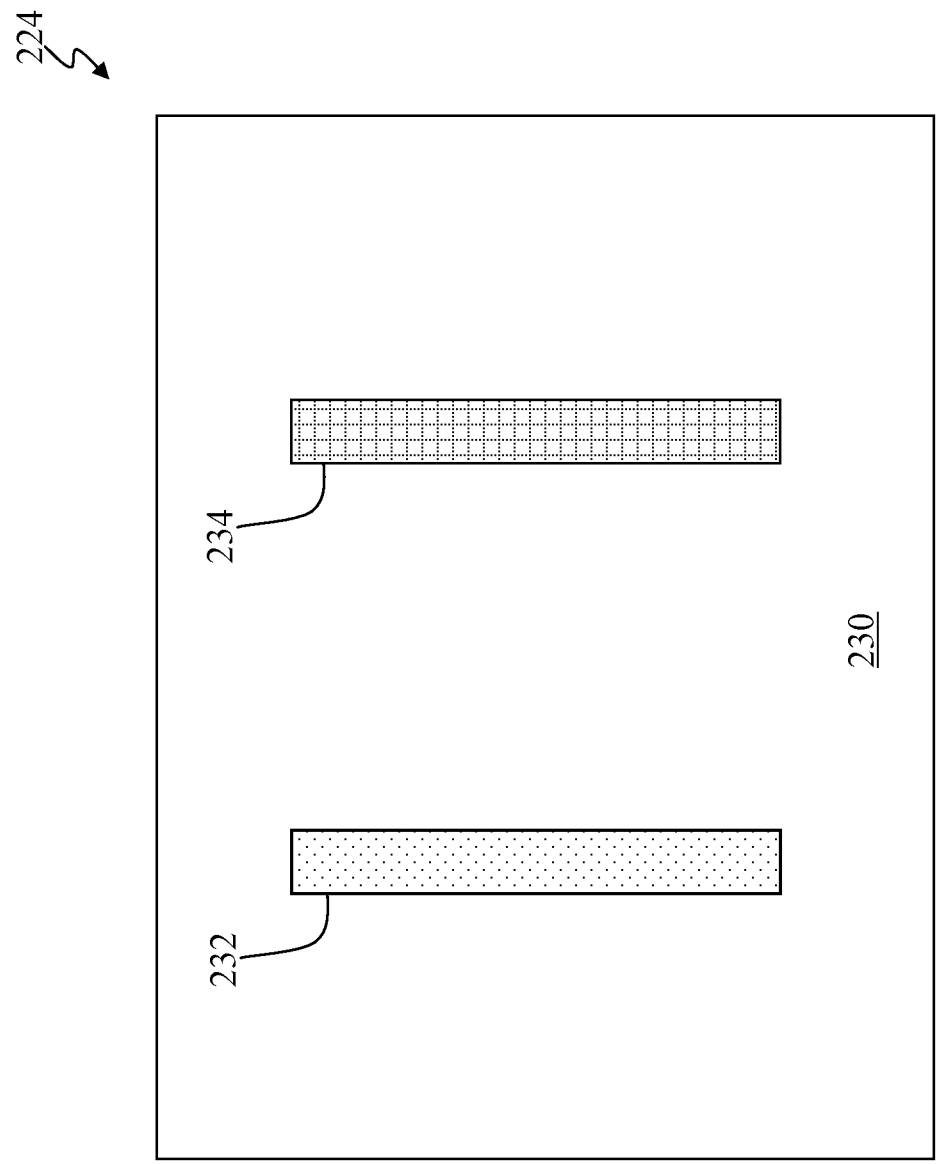

Referring to FIG. 7, a second structure 234 is formed on a second layer of the substrate 230. The second layer may be a poly layer. The second structure 234, for example, may be a second poly-gate structure formed on the second layer of the integrated circuit region 224. Forming the second structure 234 may include one or more patterning, optical exposure, e-beam exposure, etching process, and/or deposition process. In the present embodiment, forming the second structure 234 includes a lithography process that optically exposes a pattern onto the second layer of the substrate 230. During the formation of the second structure 234 on the second layer, an alignment technique is used to properly align the second layer (including the second structure 234) with respect to the first layer (including the first structure 232) and to determine the placement information of the second layer/structure. The pattern alignment technique is similar to the pattern alignment technique as described above, which, for example, may use alignment marks formed in alignment regions of the wafer (see FIGS. 3-4). The pattern alignment technique may use placement information data from the first data file. The placement information data of the second structure 234 and the second layer, along with other multiple sets of parameters, is stored in a second data file which is used in subsequent alignment. The data file may be, for example, a .txt data file, or any other data file format.

Figure 8:
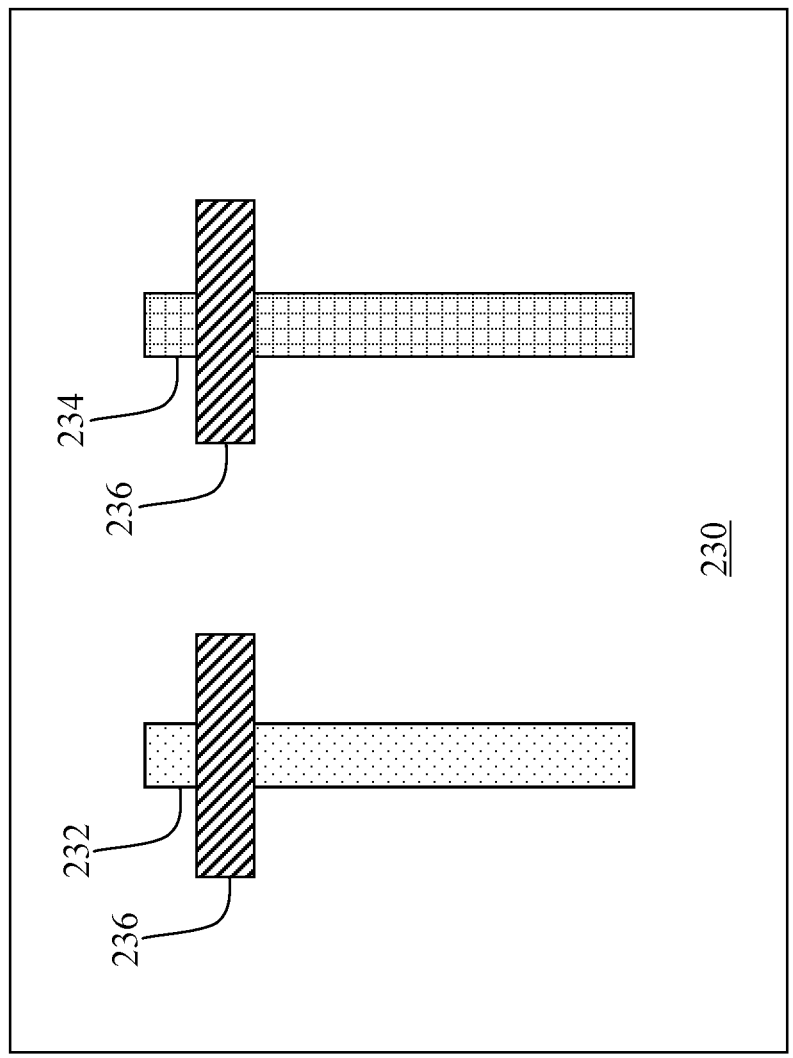

Referring to FIG. 8, a third structure 236 is formed on a third layer of the substrate 230. The third layer may be an active layer. The third structure 236, for example, may be active regions formed on the third layer of the integrated circuit region 224. Forming the third structure 236 may include one or more patterning, optical exposure, e-beam exposure, etching process, and/or deposition process. In the present embodiment, forming the third structure 236 includes a lithography process that optically exposes a pattern onto the third layer of the substrate 230. During the formation of the third structure 236 on the third layer, an alignment technique is used to properly align the first and second layers with the third layer and to determine the placement information of the third layer/structure 236. The pattern alignment technique is similar to the pattern alignment technique as described above, which, for example, may use alignment marks formed in alignment regions of the wafer (see FIGS. 3-4). The alignment technique may include using prior alignment and/or placement information data from the data files (e.g., first and second data files) such that the third structure 236 may be properly aligned on the first and second structures 232, 234, respectively. The placement information data of the third structure 236 and the third layer, along with other multiple sets of parameters, is stored in a third data file which is used in subsequent alignment. The data file may be, for example, a .txt data file, or any other data file format.

Figure 9:
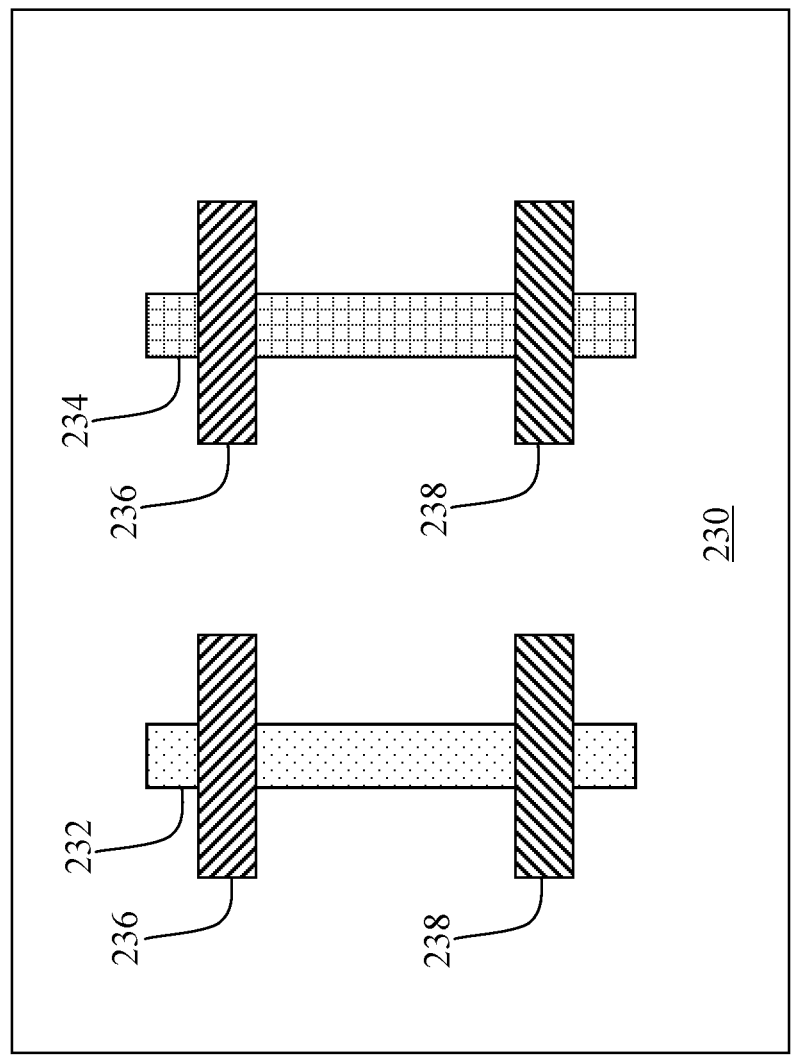

Referring to FIG. 9, a fourth structure 238 is formed on a fourth layer of the substrate 230. The fourth layer may be an active layer. The fourth structure 238, for example, may be active regions formed on the fourth layer of the integrated circuit region 224. Forming the fourth structure 238 may include one or more patterning, optical exposure, e-beam exposure, etching process, and/or deposition process. In the present embodiment, forming the fourth structure 238 includes a lithography process that optically exposes a pattern onto the fourth layer of the substrate 230. During the formation of the fourth structure 238 on the fourth layer, an alignment technique is used to properly align the first, second, and third layers with the fourth layer and to determine the placement information of the fourth layer. The pattern alignment technique is similar to the pattern alignment technique as described above, which, for example, may use alignment marks formed in alignment regions of the wafer (see FIGS. 3-4). The alignment technique may include using prior alignment and/or placement information data from the data files (e.g., first, second, and third data files) such that the fourth structure 238 may be properly aligned on the first, second, and third structures 232, 234, 236. The placement information data of the fourth structure 238 and the fourth layer, along with other multiple sets of parameters, is stored in a fourth data file which is used in subsequent alignment. The data files may be, for example, a .txt data file, or any other data file format. The data files (e.g., first, second, third, and fourth data files) may be a single file including data of the first, second, third, and fourth structures/layers. Conversely, each structure/layer may have a separate data file. It is understood that the numbers of files (e.g., one or more files per one or more layers/structures) or the file type (e.g., txt) is not intended to be limiting unless expressly claimed.

Figure 10:
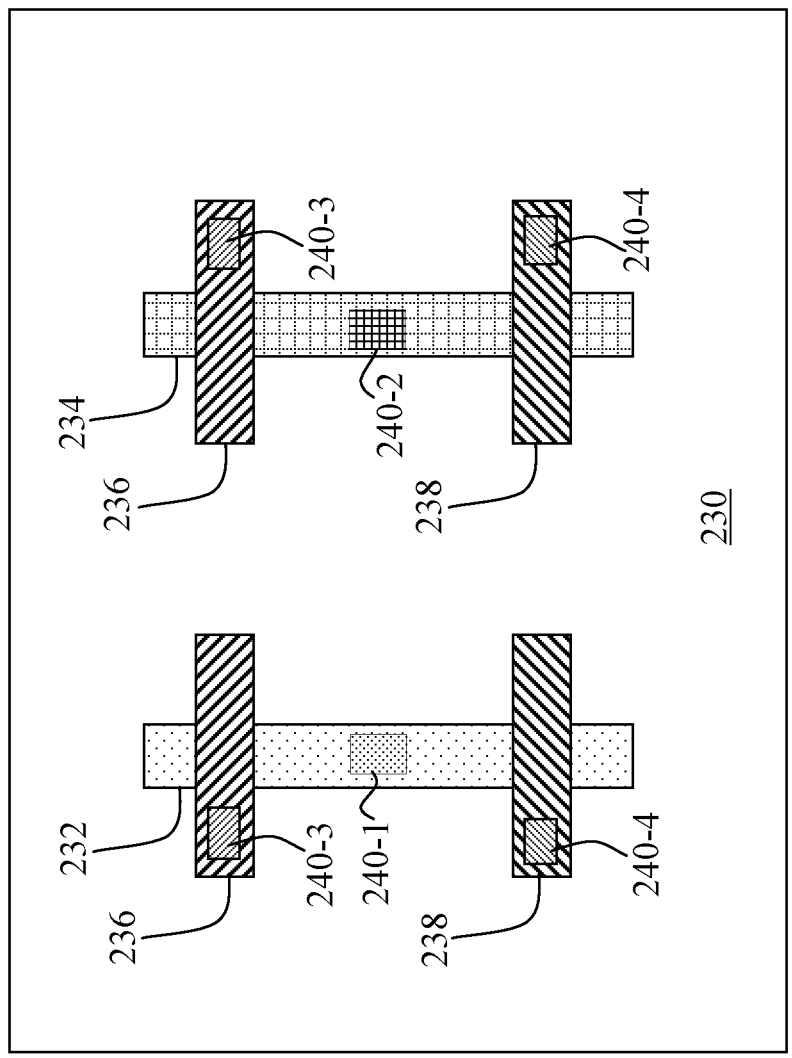

Referring to FIG. 10, a fifth structure 240 including one or more substructures 240-1, 240-2, 240-3, and 240-4, are formed on a fifth layer of the substrate 230. The fifth layer may be a contact layer. The fifth structure may be a top/final structure relative to the previous structures (e.g., first to fourth structures). The fifth structure 240, for example, may include one or more contacts (e.g., substructures 240-1, 240-2, 240-3, and 240-4) formed on a fifth layer of the integrated circuit region 224. Forming the fifth structure 240 may include one or more patterning, optical exposure, e-beam exposure, etching process, and/or deposition process. In the present embodiment, forming the fifth structure 240 includes an e-beam exposure that forms a pattern onto the fifth layer of the substrate 230. The e-beam exposure that forms the pattern onto the fifth layer of the substrate 230 may expose the pattern for each substructure 240-1, 240-2, 240-3, and 240-4 of the fifth structure 240 all at the same time (i.e., simultaneously) or at separate times (i.e., in sequence). Forming the pattern of the fifth structure 240 by e-beam exposure includes using the prior alignment and/or placement information from each file (e.g., first, second, third, and fourth data files) such that each substructure 240-1, 240-2, 240-3, and 240-4 of the fifth structure 240 may be properly and independently aligned to the first, second, third, and fourth structures, 232, 234, 235, and 238, respectively. During the formation of the fifth structure 240, the placement information of the fifth layer/structure 240 (including substructure 240-1, 240-2, 240-3, and 240-4) may be determined from the alignment marks and stored in a fifth data file.

For example, aligning the first substructure 240-1 to the first structure 232 includes using the first data file, which includes the placement information of the first layer and the first structure 232, to calculate the placement difference between first substructure 240-1 and the first structure 232 to independently align the first substructure 240-1 to the first structure 232. As such, the alignment of the first substructure 240-1 to the first structure 232 is not affected by the placement information of the second, third, and fourth layers/structures. In other words, the alignment of the first substructure 240-1 with the first layer and first structure 232 is decoupled from the alignment of other substructures with their respective layers and structures.

As a further example, aligning the second substructure 240-2 to the second structure 234 includes using the second data file, which includes the placement information of the second layer and the second structure 234, to calculate the placement difference between the second substructure 240-2 and the second structure 234 to independently align the second substructure 240-2 to the second structure 234. As such, the alignment of the second substructure 240-2 to the second structure 234 is not affected by the placement information of the first, third and fourth layers/structures. This approach is also used to align each substructure 240-3 and 240-4 to the underlying structures 236 and 238 of layers three and four, respectively.

Accordingly, the decoupling method (i.e., using separate data files to align each substructure to each underlying structure/layer) allows for individual alignment of each substructure/structure. After the alignment process, the fifth layer is exposed to an e-beam to define the pattern of the fifth structure 240 (including substructures 240-1, 240-2, 240-3, and 240-4). After forming the pattern of the fifth structure, the fifth structure 240 is formed, for example, by an etching and a deposition process thereby forming the fifth structure 240 including substructures (e.g., 240-1, 240-2, 240-3, and 240-4). Notably, each of the substructures (e.g., 240-1, 240-2, 240-3, and 240-4) is independently aligned with each underlying structure of each underlying layer.

A benefit of the method 100 disclosed herein is that the total overlay error is decoupled by independently aligning multiple layers having patterns/structures thereon. Independently aligning multiple layers may be performed, for example, by aligning one pattern/structure with an upper pattern/structure without regard to the alignment of other patterns/structures (e.g., only using alignment data of the pattern/structure that the upper pattern/structure is to be aligned with). Methods which do not decouple overlay error have a total overlay error (TOE)= $\sqrt{OE1^2+OE2^2+OE3^2+...OEn^2}$, where OE1 is the overlay error between the n+1 layer/structure and the first layer/structure, OE2 is the overlay error between the n+1 layer/structure and the second layer/structure, and so on until the $n^{th}$ layer/structure having OEn. In contrast, decoupling the overlay error results in a reduced TOE. For example decoupling may result in a TOE=MAX (OE1, OE2, OE3, ... OEn). The TOE may be reduced, by the disclosed method, such that the manufacturing tool capacity tolerance/limit(s) is/are reached. Accordingly, the disclosed method allows for a reduction in TOE thereby allowing for proper alignment of multiple layers/structures and thus improving device performance/reliability. Further, the method disclosed for achieving the reduced overlay error, described herein is easily implemented into current processing. Different embodiments may have different advantages, and no particular advantage is necessarily required of any embodiment.

The chip 220-1 may include additional features, which may be formed by subsequent processing. For example, various contacts/vias/lines and multilayer interconnect features (e.g., metal layers and interlayer dielectrics) may be formed over the substrate, configured to connect the various features or structures of the chip 220-1. The additional features may provide electrical interconnection to the chip 220-1. For example, a multilayer interconnection includes vertical interconnects, such as conventional vias or contacts, and horizontal interconnects, such as metal lines. The various interconnection features may implement various conductive materials.

Thus, provided is a method. An exemplary method includes forming a first structure in a first layer by a first exposure and determining placement information of the first structure. The method further includes forming a second structure in a second layer overlying the first layer by a second exposure and determining placement information of the second structure. The method further includes forming a third structure including first and second substructures in a third layer overlying the second layer by a third exposure. Forming the third structure includes independently aligning the first substructure to the first structure and independently aligning the second substructure to the second structure In some embodiments, the method further includes storing the placement information of the first structure in a data file and storing the placement information of the second structure in the data file, and independently aligning the first substructure includes using the placement information of the first structure from the data file, and independently aligning the second substructure includes using the placement information of the second structure from the data file.

In some embodiments, determining the placement information of the first structure includes obtaining alignment data of the first structure from an alignment mark, and determining the placement information of the second structure includes obtaining alignment data of the second structure from the alignment mark. In various embodiments, the alignment mark includes a first alignment mark associated with the first structure and a second alignment mark associated with the second structure. In certain embodiments, the alignment mark is formed in an active layer, a poly layer, and/or a contact layer. In further embodiments, the first exposure is an optical exposure, the second exposure is an optical exposure, and the third exposure is an electron beam exposure. In some embodiments, the data file includes a first data file associated with the first structure and a second data file associated with the second structure. In various embodiments, the first structure includes a first poly-gate, the second structure includes a second poly-gate, and the third structure includes a first contact associated with the first substructure and a second contact associated with the second substructure. In certain embodiments, the e-beam exposure is performed simultaneously thereby exposing a first pattern defining the first substructure and a second pattern defining the second substructure. In some embodiments, the e-beam exposure is performed in sequence thereby first exposing a first pattern defining the first substructure and thereafter exposing a second pattern defining the second substructure.

Also provided is a alternative embodiment of a method. The exemplary method includes forming a first layer including a first structure on a substrate. The method further includes obtaining first layer alignment data from an alignment mark and determining first placement information data from the first layer alignment data. The method further includes forming a second layer including a second structure over the first layer. The method further includes obtaining second layer alignment data from the alignment mark and determining second placement information data from the second layer alignment data. The method further includes forming a third layer including a third structure over the second layer. The third structure includes a first substructure and a second substructure. Forming the third structure includes using the first placement information data to independently align the first substructure to the first structure and using the second placement information data to independently align the second substructure to the second structure.

In some embodiments, the method further includes obtaining third layer alignment data from the alignment mark and determining third placement information data from the third layer alignment data. Obtaining third layer alignment data includes obtaining first substructure alignment data and second substructure alignment data.

In some embodiments, forming the second structure includes using the first placement information data to align the second layer to the first layer. In various embodiments, the first placement information data includes a first translational error and a first rotational error of the first layer, and the second placement information data includes second translational error and second rotational error of the second layer.

Also provided is yet another alternative method. The method includes forming a first structure in a first layer of a substrate. Forming the first structure includes a first exposure process that forms a first pattern that defines the first structure. The method further includes forming a second structure in a second layer of a substrate. The second layer overlays the first layer. Forming the second structure includes a second exposure process that forms a second pattern that defines the second structure. The method further includes forming a final structure including a first and second substructure in a final layer of the substrate. The final layer overlays the first and second layers. Forming the final structure includes a final exposure process that forms a final pattern that defines the final structure. Forming the final structure includes using first alignment data to independently align the first substructure to the first structure and using second alignment data to independently align the second substructure to the second structure.

In some embodiments, the method further includes forming a third structure in a third layer of a substrate, wherein the third layer overlays the second layer, wherein forming the third structure includes a third exposure process that forms a third pattern that defines the third structure; and forming a fourth structure in a fourth layer of a substrate, wherein the fourth layer overlays the third layer and underlies the final layer, wherein forming the fourth structure includes a fourth exposure process that forms a fourth pattern that defines the fourth structure. The final structure includes a third substructure and a fourth substructure. Forming the final structure includes using a third data file to independently align the third substructure to the third structure and using a fourth data file to independently align the fourth substructure to the fourth structure.

In further embodiments, the first data file includes first placement information data associated with the first structure, the first placement information data being obtained from a first alignment mark. The second data file includes second placement information data associated with the second structure, the second placement information data being obtained from a second alignment mark. In yet further embodiments, the third data file includes third placement information data associated with the third structure, the third placement information data being obtained from a third alignment mark. The fourth data file includes fourth placement information data associated with the fourth structure, the fourth placement information data being obtained from a fourth alignment mark. And, the final placement information data associated with the final structure is obtained from a final alignment mark. The total overlay error (TOE) is less than $\sqrt{OE1^2+OE2^2+OE3^2+OE4^2+OEn^2}$, wherein OE1 is the overlay error between a n+1 structure and the first structure, wherein OE2 is the overlay error between the n+1 structure and the second structure, wherein OE3 is the overlay error between the n+1 structure and the third structure, wherein OE4 is the overlay error between the n+1 structure and the fourth structure, and wherein OEn is the overlay error between the n+1 structure and the $n^{th}$ (final) structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first layer including a first structure on a substrate;
obtaining first layer alignment data from an alignment mark;
determining first placement information data from the first layer alignment data;
forming a second layer including a second structure over the first layer;
obtaining second layer alignment data from the alignment mark;
determining second placement information data from the second layer alignment data;
forming a third layer including a third structure over the second layer, the third structure including a first substructure and a second substructure,
wherein forming the third structure includes using the first placement information data to independently align the first substructure to the first structure and using the second placement information data to independently align the second substructure to the second structure.

2. The method of claim 1 further comprising:
obtaining third layer alignment data from the alignment mark;
determining third placement information data from the third layer alignment data,
wherein obtaining third layer alignment data includes obtaining first substructure alignment data and second substructure alignment data.

3. The method of claim 1 wherein forming the second structure includes using the first placement information data to align the second layer to the first layer.

4. The method of claim 1 wherein the first placement information data includes a first translational error and a first rotational error of the first layer, and
wherein the second placement information data includes second translational error and second rotational error of the second layer.

5. The method of claim 1 wherein forming the first structure includes a first exposure process that forms a first pattern on the first layer, and
wherein forming the second structure includes a second exposure process that forms a second pattern on the second layer, and
wherein forming the third structure includes an electron beam exposure process that forms a third pattern on the third layer.

6. A method comprising:
forming a first structure in a first layer;
determining placement information of the first structure;
forming a second structure in a second layer overlying the first layer;
determining placement information of the second structure;
forming a third structure including first and second substructures in a third layer overlying the second layer,
wherein forming the third structure includes using the placement information of the first structure to independently align the first substructure to the first structure and using the placement information data of the second structure to independently align the second substructure to the second structure.

7. The method of claim 6 wherein determining the placement information of the first structure includes obtaining alignment data of the first structure from an alignment mark, and
wherein determining the placement information of the second structure includes obtaining alignment data of the second structure from the alignment mark.

8. The method of claim 7 wherein the alignment mark includes a first alignment mark associated with the first structure and a second alignment mark associated with the second structure.

9. The method of claim 8 further comprising:
storing the placement information of the first structure in a data file; and
storing the placement information of the second structure in the data file,
wherein independently aligning the first substructure includes using the placement information of the first structure from the data file, and
wherein independently aligning the second substructure includes using the placement information of the second structure from the data file.

10. The method of claim 9 wherein the data file includes a first data file associated with the first structure and a second data file associated with the second structure.

11. A method comprising:
forming a first structure in a first layer of a substrate;
obtaining first layer alignment data from an alignment mark;
determining first placement information data from the first layer alignment data;
forming a second structure in a second layer of a substrate, wherein the second layer overlays the first layer;
obtaining second layer alignment data from the alignment mark;
determining second placement information data from the second layer alignment data;
forming an $n^{th}$ structure in an $n^{th}$ layer of a substrate, the $n^{th}$ structure including a first substructure and a second substructure, wherein the $n^{th}$ layer overlays the second layer, wherein forming the nth structure includes using the first placement information data to independently align the first substructure to the first structure and using the second placement information data to independently align the second substructure to the second structure.

12. The method of claim 11 further comprising:
obtaining $n^{th}$ layer alignment data from the alignment mark;
determining $n^{th}$ placement information data from the $n^{th}$ layer alignment data,
wherein obtaining $n^{th}$ layer alignment data includes obtaining first substructure alignment data and second substructure alignment data.

13. The method of claim 11 wherein forming the second structure includes using the first placement information data to align the second layer to the first layer.

14. The method of claim 11 wherein the first placement information data includes a first translational error and a first rotational error of the first layer, and
wherein the second placement information data includes second translational error and second rotational error of the second layer.

15. The method of claim 11 wherein forming the first structure includes a first exposure process that forms a first pattern on the first layer, and
- wherein forming the second structure includes a second exposure process that forms a second pattern on the second layer, and
- wherein forming the $n^{th}$ structure includes an electron beam exposure process that forms an $n^{th}$ pattern on the $n^{th}$ layer.

16. The method of claim 11 further comprising:
storing the first placement information in a data file; and
storing the second placement information in the data file,
- wherein independently aligning the first substructure includes using the first placement information from the data file, and
- wherein independently aligning the second substructure includes using the second placement information from the data file.

17. The method of claim 11 wherein the alignment mark is formed in an active layer, a poly layer, and/or a contact layer.

18. The method of claim 16 wherein the data file includes a first data file associated with the first structure and a second data file associated with the second structure.

19. The method of claim 11 wherein the first structure includes a first poly-gate,
- wherein the second structure includes a second poly-gate, and
- wherein the $n^{th}$ structure includes a first contact associated with the first substructure and a second contact associated with the second substructure.

20. The method of claim 11 wherein a total overlay error (TOE) is less than $\sqrt{OE1^2+OE2^2}$, wherein OE1 is the overlay error between the $n^{th}$ structure and the first structure, wherein OE2 is the overlay error between the $n^{th}$ structure and the second structure.

* * * * *